United States Patent [19]

Hirota

[11] Patent Number: 5,251,038
[45] Date of Patent: Oct. 5, 1993

[54] SOLID STATE IMAGER WITH A CONDENSER LENS ON A PHOTO SENSOR

[75] Inventor: Isao Hirota, Kanagawa, Japan
[73] Assignee: Sony Corporation, Tokyo, Japan
[21] Appl. No.: 826,517
[22] Filed: Jan. 27, 1992
[30] Foreign Application Priority Data Jan. 28, 1991 [JP] Japan .................. 3-026889

[51] Int. Cl.⁵ .................. H04N 3/14; H04N 5/225; G02B 13/16
[52] U.S. Cl. .................. 358/225; 358/213.11; 250/216; 257/432; 257/436; 359/642
[58] Field of Search .................. 358/225, 55, 41, 43, 358/44, 213.24, 213.11; 359/642, 648, 649, 741, 742; 357/30 M, 29; 250/208.1, 216

[56] References Cited

U.S. PATENT DOCUMENTS

| | | | |
|---|---|---|---|
| 3,603,723 | 5/1968 | Tan | 358/225 |
| 4,323,925 | 3/1982 | Abell et al. | 358/225 |
| 4,377,753 | 3/1983 | Mir | 250/208.1 |
| 4,410,804 | 10/1983 | Stauffer | 250/216 |
| 4,561,015 | 12/1985 | Korch | 358/55 |
| 4,830,481 | 5/1989 | Futhey et al. | 359/565 |
| 5,028,547 | 7/1991 | Iizuka et al. | 358/43 |
| 5,046,159 | 9/1991 | Hamanaka | 358/213.13 |
| 5,132,251 | 7/1992 | Kim et al. | 358/41 |

FOREIGN PATENT DOCUMENTS 2103962 4/1990 Japan .................. 358/213.24

Primary Examiner—Michael T. Razavi
Assistant Examiner—Wendy R. Greening
Attorney, Agent, or Firm—Hill, Steadman & Simpson

[57] ABSTRACT

The present invention is directed to a CCD solid state imager in which a utilization efficiency of light and a sensitivity of a sensitive unit (pixel) can be increased and a smear can be reduced by improving a shape of a micro-condenser lens formed on the sensitive unit. In the CCD solid state imager of this invention, of four corner portions of the condenser lens, shapes of the three corner portions are round-cornered similarly to corner portions of a sensitive unit opening and the remaining corner portion of the condenser lens is cut along the direction inclined relative to a central line of the condenser lens (i.e., in the direction having an inclined angle of substantially 45 degrees).

5 Claims, 4 Drawing Sheets

SOLID STATE IMAGER WITH A CONDENSER LENS ON A PHOTO SENSOR

BACKGROUND OF THE INVENTION

1. Field of the Invention

The present invention generally relates to solid state imagers and, more particularly, to a shape of a micro-condenser lens provided on a sensitive unit of a solid state imager.

2. Description of the Prior Art

In a solid state imager such as a charge-coupled device (CCD) solid state imager, considering a relation among an electrical charge, a noise and an illumination on an image surface on the CCD, it is known that influences of a noise (shot noise) caused by unstable electric charges and a dark field noise are increased on the low illumination side.

In order to reduce the above-mentioned shot noise, it is sufficient to increase an aperture efficiency of the sensitive unit. However, there is a limit on the increase of the above aperture efficiency because the solid state imager has been more and more miniaturized recently. To solve this problem, one such structure for the solid state imager is proposed at present, in which a micro-condenser lens is formed on the sensitive unit. According to this previously-proposed structure in which the micro-condenser lens is formed on the sensitive unit, a utilization factor of light can be increased, a sensitivity on the sensitive unit can be increased and the above shot noise can be effectively reduced. Japanese Laid-Open Patent Publications Nos. 60-53073 and 1-10666 describe methods of forming a micro-condenser lens.

The conventional micro-condenser lens is shaped as in two types of a so-called stripe type in which a single consecutive semi-cylindrical lens B is formed on a group of sensitive units (pixels) 11 with respect to one column or one row as shown in FIG. 1 and of a so-called discrete type in which a lens C is formed on every sensitive unit (pixel) 11 in a separate fashion as shown in FIG. 2. Comparing two kinds of condenser lenses B and C from a standpoint of a utilization efficiency of a light incident on the same point, a light incident on a point Px is converged into an opening 12 of the sensitive unit 11 both in the condenser lenses B and C but a light incident on a point Py cannot be converged into the opening 12 of the sensitive unit 11 according to the condenser lens B of the stripe type. More specifically, in the condenser lens B of the stripe type, the portions thereof other than the sensitive unit opening 12 in the axial direction become invalid portions M for an incident light. In the case of the condenser lens C of the discrete type, the light incident on the point Py can be converged into the sensitive unit opening 12 and therefore, the latter condenser lens C of the discrete type has the advantage such that the utilization factor of light and the sensitivity of the sensitive unit can be increased.

Most of the circumferential edge of the conventional discrete type condenser lens C is shaped as a rectangle and the circumferential edge of the sensitive unit opening 12 is round-cornered in actual practice at corner portions 13 because the opening 12 is formed by the etching-process or the like. Accordingly, as shown in FIG. 2, a horizontal length Ln between a corner portion 14 of the lens C and the corresponding corner portion 13 of the opening 12 is increased so that particularly a light incident on a point of the lens C near its corner portion 14, e.g., a point Pc cannot be converged into the sensitive unit opening 12. Further, if cut surfaces of mountain-like configuration are formed on the corner portions 14 of the lens C in the process of forming the lens C as shown in FIG. 3, then a light incident near a boundary n of the cut surface, i.e., a light incident on each of points point Pd at both sides of boundary n is not converged to the sensitive unit opening 12 but converged to the direction of the adjacent cut surfaces as shown by arrows A and B in FIG. 3. There is then the disadvantage that the utilization efficiency of light is reduced more.

OBJECTS AND SUMMARY OF THE INVENTION

Therefore, it is an object of the present invention to provide an improved solid state imager in which the aforesaid shortcomings and disadvantages encountered with the prior art can be eliminated.

More specifically, it is an object of the present invention to provide a solid state imager in which a utilization factor of light and a sensitivity of a sensitive unit can be increased by improving a shape of a micro-condenser lens.

Another object of the present invention is to provide a solid state imager in which a smear can be reduced.

As an aspect of the present invention, a solid state imager is comprised of a sensitive unit, and a condenser lens of a discrete type formed on the sensitive unit, wherein a distance of horizontal direction between the sensitive unit and the condenser lens becomes substantially approximate values at respective positions.

According to the arrangement of the present invention, lights incident on other portions than the corner portions of the condenser lens and lights incident near the corner portions of the condenser lens can all be converged into a sensitive unit opening. As a consequence, a utilization efficiency of light and a sensitivity of the sensitive unit can be increased and a smear can be reduced.

The preceding and other objects, features, and advantages of the present invention will become apparent from the following detailed description of an illustrative embodiment thereof to be read in conjunction with the accompanying drawings.

DETAILED DESCRIPTION OF THE PREFERRED EMBODIMENT

An embodiment of the present invention will now be described with reference to FIG. 4.

Figure 1:
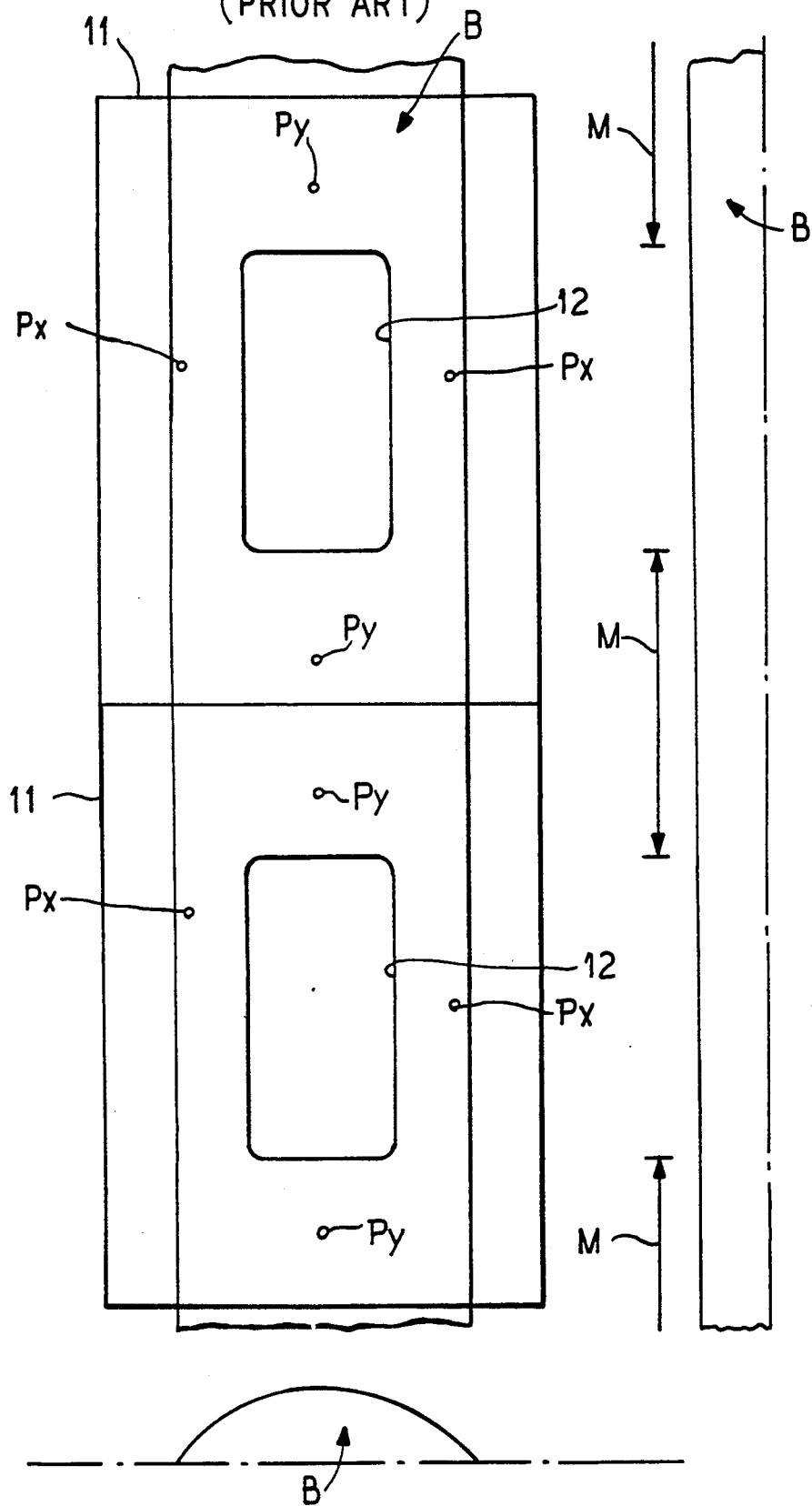
FIG. 1 is an explanatory diagram showing a shape of a conventional micro-condenser lens of a stripe type.
Figure 2:
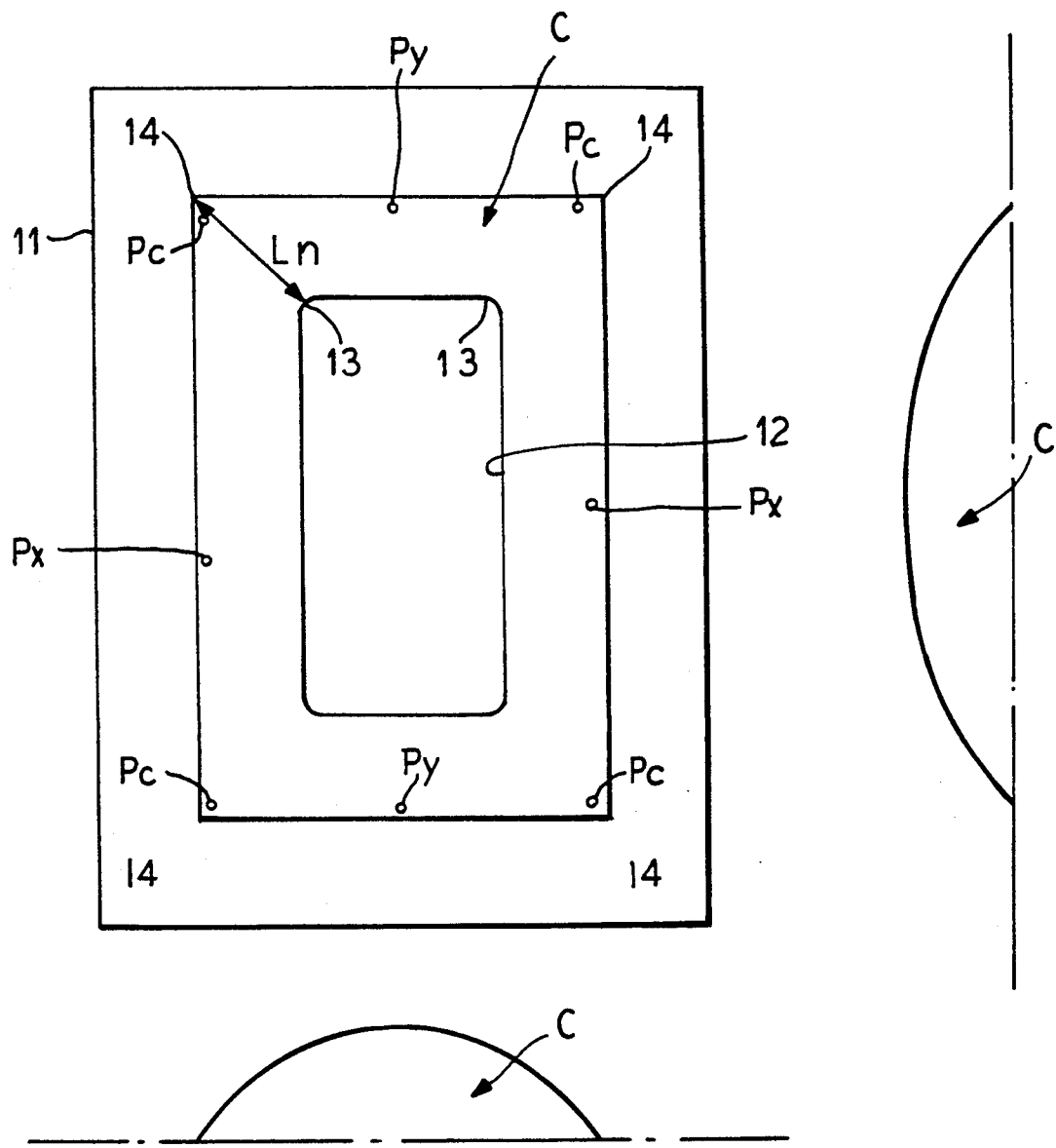
FIG. 2 is an explanatory diagram showing a shape of a conventional micro-condenser lens of a discrete type.
Figure 3:
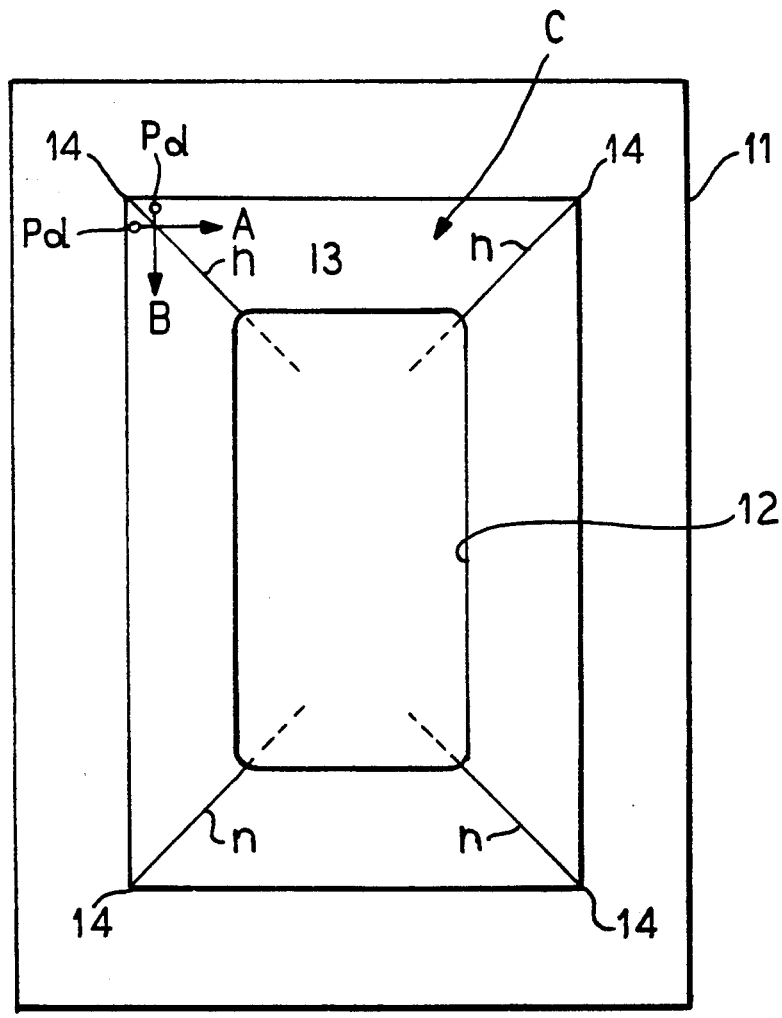
FIG. 3 is an explanatory diagram showing a shape of other example of the conventional micro-condenser lens of the discrete type.
Figure 4:
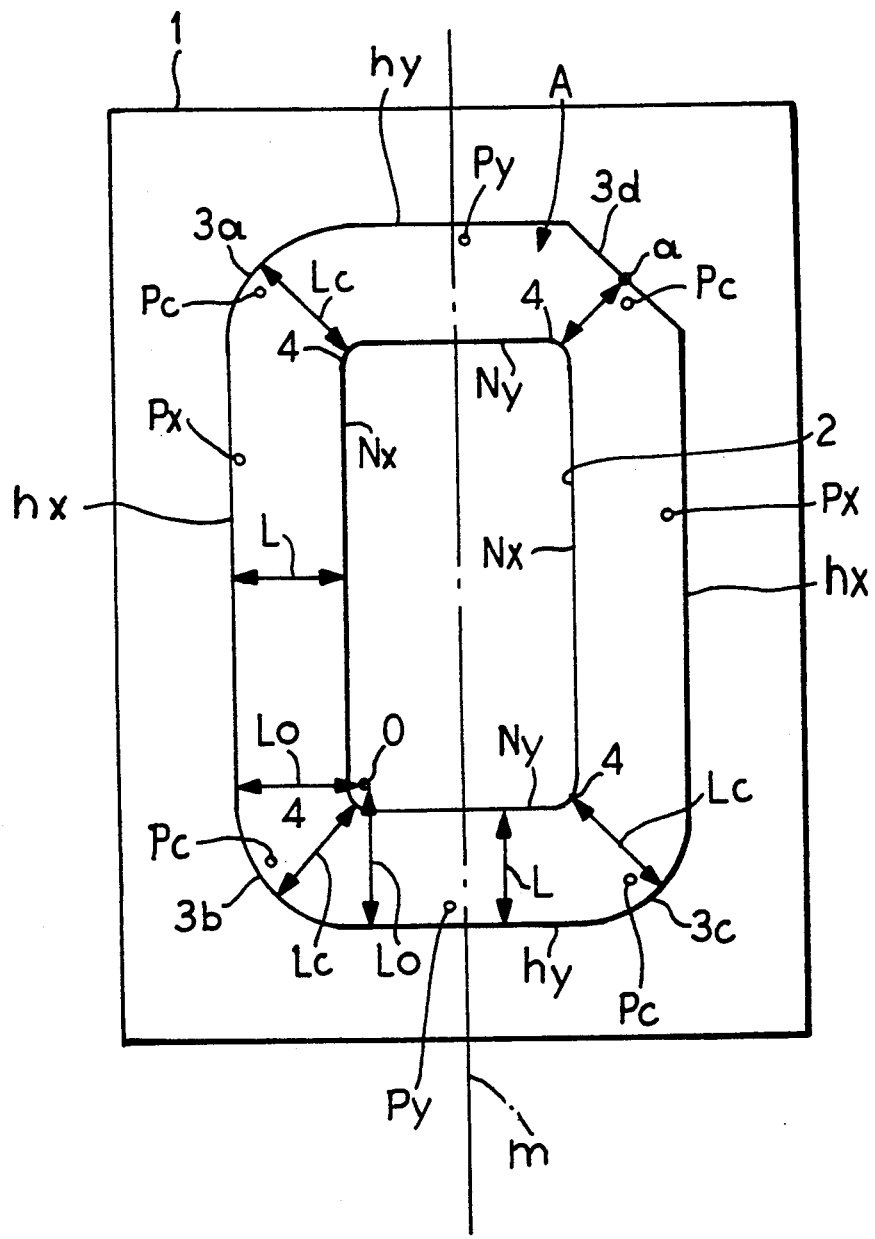
FIG. 4 is a plan view illustrating a main portion of a solid state imager according to an embodiment of the present invention, for example, a shape of a micro-condenser lens used therein.

FIG. 4 is a plan view showing a shape of a micro-condenser A formed on a CCD solid state imager according to the embodiment of the present invention. This condenser lens A is what might be called a discrete type in which the condenser lens A is separately formed on every sensitive unit (pixel).

In this embodiment, the circumferential edge of the condenser lens A is shaped substantially similarly to the circumferential edge of opening 2 of a sensitive unit 1. More specifically, in the illustrative embodiment, of four corner portions through 3a through 3d of the condenser lens A, the three corner portions 3a, 3b and 3c are round-cornered similarly to corner portions 4 of the sensitive unit opening 2 and the remaining corner portion 3d is cut along the direction inclined relative to a central line m (i.e., direction of an inclined angle of substantially 45 degrees) of the condenser lens A.

To be more concrete, assuming that Lo is a distance from a center 0 of curvature in the corner portion 4 of the opening 2 to sides hx and hy of the lens A in the circumferential edge of the lens A which are extending in the row and column directions, then the above-mentioned three corner portions 3a, 3b and 3c of the lens A are shaped as curved lines, each having the distance Lo as the radius of curvature. In that event, a distance Lc from each corner portion 4 of the opening 2 to each of the corresponding corner portions 3a, 3b, 3c of the lens A becomes substantially the same as a distance L from each of sides Nx, Ny of the opening 2 in the circumferential edge of the opening 2 which are extending in the row and column directions to each of the corresponding sides hx, hy of the lens A (L=Lc). That is, the distances Lc and the distance L between the circumferential edge of the opening 2 and the circumferential edge of the lens A become substantially approximate values at respective positions. Further, each of the corner portions of the lens A is formed substantially as a spherical shape. On the other hand, in the corner portion 3d cut along the slant direction in the lens A, assuming that Ld represents a distance from a center a of the cut side (corner portion 3d) to the corresponding corner portion 4 of the above-mentioned opening 2, then an inequality of Ld<Lc is established.

As described above, according to this embodiment, since the condenser lens A is formed such that the distances Lc and the distance L between the circumferential edge of the opening 2 and the circumferential edge of the lens A become substantially approximate values, lights incident on other portions than the corner portions of the lens A, for example, the points Px, Py and points near the corner portions, e.g., points Pc can be all converged into the sensitive unit opening 2. As a consequence, the utilization efficiency of light and the sensitivity in the sensitive unit (pixel) 1 can be increased, and also the smear can be reduced.

While the present invention is applied to the CCD solid state imager as described above, the present invention is not limited thereto and may be applied to a variety of solid state imagers such as an amplified MOS (metal oxide semiconductor) intelligent imager (AMI) fabricating an amplifying circuit into a pixel, a solid state imager formed of a static induction transistor (SIT) in which one pixel is formed of a static induction transistor, a charge modulation device (CMD) in which a pixel is formed of a MOS transistor, an avalanche photodiode (APD) solid state imager using an avalanche photodiode or the like.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A solid state imager, comprising:
   a substrate;
   a photosensor formed on said substrate, said photosensor having a sensor opening through which light is received, said sensor opening having a plurality of rectilinear sides and rounded corners joining said sides; and
   a condenser lens secured over said photosensor, said condenser lens having a base with a plurality of rectilinear sides and rounded corners joining said sides corresponding to those of said sensor opening, but of greater dimension, corners of said condenser lens being formed to be substantially spherical in shape so that incident light through said corners converges into said sensor opening, a distance in a horizontal direction between said corners of said sensor opening and said corners of said condenser lens is substantially approximate to a distance in a horizontal direction between said sides of said sensor opening and said sides of said condenser lens.

2. The solid state imager of claim 1 wherein each of said sensor opening and said base of said lens is substantially rectangular in periphery.

3. A solid state imager, comprising:
   a substrate;
   a photosensor formed on said substrate, said photosensor having a sensor opening through which light is received, said sensor opening having a plurality of rectilinear sides and rounded corners joining said sides; and
   a condenser lens secured over said photosensor, said condenser lens having a base with a plurality of rectilinear sides and rounded corners joining said sides corresponding to those of said sensor opening, but of greater dimension, corners of said condenser lens being formed to be substantially spherical in shape so that incident light through said corners converges into said sensor opening, a distance in a horizontal direction between said corners of said sensor opening and said corners of said condenser lens is substantially approximate to a distance in a horizontal direction between said sides of said sensor opening and said sides of said condenser lens, at least one corner being cut off at a slant so that incident light through a point near said cut corner of said condenser lens converges into said sensor opening.

4. The solid state imager of claim 3, wherein a distance along a horizontal direction between said cut corner and a corresponding corner of said sensor opening is shorter than a distance between said sides of said sensor opening and said sides of said condenser lens.

5. The solid state imager of claim 3 wherein each of said sensor opening and said base of said lens is substantially rectangular in periphery.

* * * * *